(12) United States Patent
Bickford et al.

(10) Patent No.: US 7,656,182 B2
(45) Date of Patent: Feb. 2, 2010

(54) TESTING METHOD USING A SCALABLE PARAMETRIC MEASUREMENT MACRO

(75) Inventors: Jeanne P. Bickford, Essex Junction, VT (US); John R. Goss, South Burlington, VT (US); Nazmul Habib, South Burlington, VT (US); Robert J. McMahon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/689,150

(22) Filed: Mar. 21, 2007

(65) Prior Publication Data
US 2008/0231307 A1 Sep. 25, 2008

(51) Int. Cl.
*G01R 31/26* (2006.01)
(52) U.S. Cl. .................................................. 324/765
(58) Field of Classification Search .................. 324/765
See application file for complete search history.

(56) References Cited

U.S. PATENT DOCUMENTS

| | | | |
|---|---|---|---|
| 4,878,209 A | 10/1989 | Bassett et al. | |
| 5,068,823 A | 11/1991 | Robinson | |
| 5,286,656 A | 2/1994 | Keown et al. | |
| 5,787,092 A | 7/1998 | Jaynes et al. | |
| 5,867,644 A | 2/1999 | Ranson et al. | |
| 6,140,832 A * | 10/2000 | Vu et al. | 324/765 |
| 6,415,402 B2 | 7/2002 | Bishop et al. | |
| 6,477,685 B1 | 11/2002 | Lovelace | |
| 6,553,545 B1 * | 4/2003 | Stinson et al. | 716/4 |
| 6,560,568 B1 | 5/2003 | Singhal et al. | |
| 6,562,639 B1 | 5/2003 | Minvielle et al. | |
| 6,720,194 B1 | 4/2004 | Miller et al. | |
| 6,721,927 B2 | 4/2004 | Croce et al. | |
| 6,772,322 B1 | 8/2004 | Merchant et al. | |
| 6,807,655 B1 | 10/2004 | Rehani et al. | |
| 6,885,955 B1 | 4/2005 | Atchison | |
| 6,898,769 B2 | 5/2005 | Nassif et al. | |
| 6,934,671 B2 | 8/2005 | Bertsch et al. | |
| 6,965,895 B2 | 11/2005 | Smith et al. | |

(Continued)

OTHER PUBLICATIONS

U.S. Appl. No. 11/459,367, filed Jul. 24, 2006.

(Continued)

*Primary Examiner*—Ha Tran T Nguyen
*Assistant Examiner*—Shaun Campbell
(74) *Attorney, Agent, or Firm*—Gibb I.P. Law Firm, LLC; Ryan K. Simmons, Esq.

(57) ABSTRACT

Disclosed are testing method embodiments in which, during post-manufacture testing, parametric measurements are taken from on-chip parametric measurement elements and used to optimize manufacturing in-line parametric control learning and/or to optimize product screening processes. Specifically, these post-manufacture parametric measurements can be used to disposition chips without shipping out non-conforming products, without discarding conforming products, and without requiring high cost functional tests. They can also be used to identify yield sensitivities to parametric variations from design and to provide feedback for manufacturing line improvements based on the yield sensitivities. Additionally, a historical database regarding the key parameters that are monitored at both the fabrication and post-fabrication levels can be used to predict future yield and, thereby, to preemptively improve the manufacturing line and/or also to update supply chain forecasts.

34 Claims, 4 Drawing Sheets

U.S. PATENT DOCUMENTS

| | | | |
|---|---|---|---|
| 6,978,229 | B1 | 12/2005 | Saxena et al. |
| 6,986,113 | B2 | 1/2006 | Sinha et al. |
| 7,003,742 | B2 | 2/2006 | Saxena et al. |
| 7,129,696 | B2 | 10/2006 | Savithri |
| 7,256,055 | B2 * | 8/2007 | Aghababazadeh et al. .... 438/11 |
| 7,299,388 | B2 * | 11/2007 | Ung et al. ................... 714/718 |
| 2002/0157051 | A1 * | 10/2002 | Eckelman et al. ........... 714/736 |
| 2002/0193892 | A1 | 12/2002 | Bertsch et al. |
| 2003/0006413 | A1 | 1/2003 | Chawla et al. |
| 2004/0015793 | A1 | 1/2004 | Saxena et al. |
| 2004/0128115 | A1 | 7/2004 | Chen et al. |
| 2005/0010546 | A1 | 1/2005 | Nowotny et al. |
| 2005/0090027 | A1 | 4/2005 | Aghababazadeh et al. |
| 2005/0090916 | A1 | 4/2005 | Aghababazadeh et al. |
| 2005/0111155 | A1 * | 5/2005 | Alam et al. .................. 361/100 |
| 2005/0239268 | A1 | 10/2005 | Pirkle et al. |
| 2006/0028229 | A1 * | 2/2006 | Subramaniam et al. ...... 324/765 |
| 2006/0158210 | A1 * | 7/2006 | Tsai et al. .................... 324/765 |
| 2006/0241802 | A1 * | 10/2006 | Chen et al. .................. 700/121 |

OTHER PUBLICATIONS

U.S. Appl. No. 11/611,623, filed Dec. 15, 2006.

* cited by examiner

TESTING METHOD USING A SCALABLE PARAMETRIC MEASUREMENT MACRO

BACKGROUND

1. Field of the Invention

The embodiments of the invention generally relate to testing methods and, more particularly, to taking parametric measurements during post-manufacture testing of chips in order to optimize manufacturing in-line parametric control learning and/or to optimize product screening processes.

2. Description of the Related Art

Generally, semiconductor chips (i.e., semiconductor products, dies, integrated circuit devices, etc.) are produced by using known processing techniques to form multiple identical products on the same wafer. Deviations in parametric measurements from what is assumed during design, either in different areas across the wafer and/or within different areas across individual chips, impact semiconductor product function in customer applications. However, parametric deviations are typically not measured post manufacture (i.e., during wafer-level testing, module-level testing, burn-in level testing, etc.), but rather are only measured during in-line testing. Unfortunately, for a number of reasons, the parametric measurements taken during in-line testing cannot readily be used to disposition semiconductor products during final testing. Additionally, for a number of reasons, these in-line parametric measurements can also not readily be used to identify parametric impact on product yield. Therefore, there is a need in the art for a testing method in which, during final testing, various electrical and physical parametric measurements are taken and used to optimize manufacturing in-line parametric control learning and/or to optimize product screening processes.

SUMMARY

In view of the foregoing, disclosed herein are testing method embodiments in which, during post-manufacture testing (e.g., during functional or scan-based testing performed after product fabrication), various electrical and physical parametric measurements are taken from on-chip parametric measurement elements and are used to optimize manufacturing in-line parametric control learning and/or to optimize product screening processes. Specifically, these post-manufacture parametric measurements can be used to disposition chips without shipping out non-conforming products, without discarding conforming products, and without requiring high cost functional tests. They can also be used to identify yield sensitivities to parametric variations from design and to provide feedback for manufacturing line improvements based on the yield sensitivities. Additionally, a historical database regarding the key parameters that are monitored at both the fabrication and post-fabrication levels can be used to predict future yield and, thereby, to preemptively improve the manufacturing line and/or also to update supply chain forecasts. Also disclosed are program storage device embodiments that are readable by computer and that tangibly embody a program of instructions executable by that computer to perform one or more of these testing method embodiments.

More specifically, in each of the testing method embodiments, chips from each lot are tested at some level after manufacture. For example, functional and/or scan-based testing is performed on chips at the wafer level, module level, burn-in level and/or any other higher level (e.g., at the application level) to determine yield loss. Additionally, as the chips are being tested at any one or all of these final testing levels, parametric measurements can be taken from at least one parametric measurement element (e.g., from one or more scalable parametric measurement macros (SPMs)) on each of the chips tested.

The parametric measurements (i.e., actual electrical and physical on-chip parametric measurements) taken during final testing can be analyzed in light of design parameters to determine variations between the actual values for specific parameters on each chip and the design values for those same parameters (i.e., to determine parametric variations). The results can be used in a variety of subsequent method steps to optimize manufacturing in-line parametric control learning and/or to optimize product screening processes.

In a first embodiment parametric control learning can be optimized and, optionally, so can product screening. That is, the first embodiment can be implemented alone or in conjunction with the below-described second embodiment. In this first embodiment, product yield loss can be correlated with the parametric measurements taken during final testing and, specifically, with any variations between the actual values for specific parameters on each chip and the design values for those same parameters in order to identify yield sensitivities to specific parametric variations. Data regarding yield sensitivity and parametric variations can be maintained and continuously updated as each new lot of wafers is tested. Additionally, the parametric variations can be ranked based on which is determined to have the greatest negative impact on yield. Then, manufacturing process and/or tool improvements can be designed to limit these variations and can be prioritized according to which will have the greatest positive impact on yield.

In a second embodiment product screening can be optimized and, optionally, so can parametric control learning. That is, the second embodiment can be implemented alone or in conjunction with the above-described first embodiment. In this second embodiment, faulty chips can be identified based on the actual parametric measurements taken during any level of the final testing and, specifically, based on any variations between the actual values for specific parameters on each chip and the design values for those same parameters. Once identified, these faulty chips can be discarded from the lot, while retaining all other chips on the wafer. Specifically, a faulty chip can be identified, for example, as any chip that has an actual parametric measurement that does not meet a predetermined chip pass/fail criterion. Alternatively, a faulty chip can be identified as any chip that has greater than a predetermined number of actual parametric measurements that do not meet predetermined pass/fail criteria.

In each of the method embodiments, the post-manufacture parametric testing can optionally be performed in addition to in-line parametric testing. Conventional in-line testing involves testing only a sample of chips selected from only a sample of wafers in a lot during manufacture. The parametric measurements are generally taken from measurement structures in the scribe lines of the selected sample of wafers. In the method embodiments disclosed herein, the scribe line measurement structures can comprise either the exact same structures as the on-chip parametric measurement elements or completely different structures, as long as they have known correlations to the on-chip parametric measurement elements. The results of the in-line parametric testing can be used in a variety of subsequent method steps.

For example, in conjunction with the first embodiment, described above, correlations can be made between the parametric measurements taken from the scribe line measurement structures during in-line testing and the parametric measurements that are subsequently taken from the on-chip parametric measurement elements during final test (i.e., in-line to post manufacture parametric measurement correlations). These correlations can later be used to predict the yield of a given lot (i.e., to make future yield predictions), based on the current in-line testing of that lot. That is, after one or more lots of wafers are manufactured and tested, correlations can be made between the in-line and post-manufacture parametric measurements. Then, when in-line testing of a new sample of chips on a new sample of wafers from a new lot is performed, predictions can be made regarding what the post-manufacture parametric measurements of the new chips will be, based on the current in-line measurements and the previously determined correlations. Since yield sensitivity to parametric measurement variations is continuously updated with each lot tested, the predicted post-manufacture parametric measurements can be used to make a yield prediction for the new lot and, thereby, to verify the effectiveness of any improvements made to the manufacturing tools and/or processes. Then, based on the yield prediction for the new lot, any additional improvement to the manufacturing tools and/or processes can be proposed and pre-emptively made and/or the supply-chain forecasts can be updated.

Additionally, these in-line to post manufacture parametric measurement correlations can be used to customize future post-manufacture testing. Specifically, these correlations can be stored along with the results of current in-line testing. Prior to final test, both the in-line to post manufacture parametric measurement correlations and the current in-line test results can be accessed and used to determine which chip sites should be used for final test. That is, the current in-line test results and in-line to post manufacture parametric measurement correlations can be used to customize final testing. Specifically, based on theses correlations the accuracy of the various in-line parametric measurements is better understood. Thus, for example, if a given in-line measurement is generally considered to be very accurate in light of the correlations and a current measurement is considered "bad" based on a predetermined criterion, then the chip site where that current measurement was taken can be considered a "known bad site" and can be removed from post-manufacture testing in order to save test-time.

In conjunction with the second embodiment, described above, which again can be implemented alone or with the first embodiment, Maverick screening (i.e., scrapping of wafers) can optionally be performed based on the results of in-line scribe line measurements. That is, after the in-line parametric testing is performed, all of the chips on all of the wafers in each lot can be passed on for final testing, regardless of the values of the in-line parametric measurements taken from the scribe line measurement structures. Thus, unlike prior art Maverick screening methods, neither entire lots, nor entire wafers, which may include good chips, are ever scrapped. Rather chips only (not wafers or lots) are scrapped and only if they fail to meet predetermined pass/fail criteria during any level of post-manufacture testing. Alternatively, after in-line testing is performed, faulty wafers within each sample of wafers tested can be identified and discarded. Then, either all remaining wafers in the lot will pass on to final testing, regardless of the number of faulty sample wafers in a lot or an entire lot will be scrapped if a specified number or more of the wafers are considered faulty.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
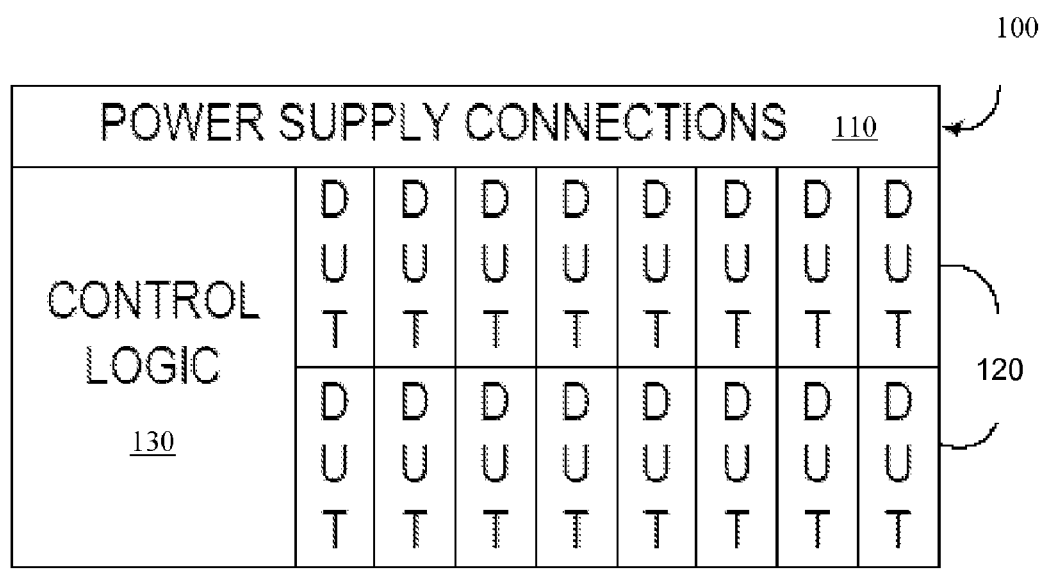
FIG. 1 is a schematic diagram illustrating an exemplary parametric measurement element 100.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, semiconductor chips (i.e., dies, semiconductor products, integrated circuit devices, etc.) are generally produced by using known processing techniques to form multiple identical chips on the same wafer. Deviations in parametric measurements from what is assumed during design, either in different areas across the wafer and/or within different areas across individual chips, impact semiconductor product function in customer applications. Parametric deviations are typically not measured post-manufacture (i.e., during wafer level testing, module level testing, burn-in level testing, etc.) but rather are measured during in-line testing. That is, the most common forms of wafer, module and burn-in level testing include functional-based testing and scan-based testing. Functional-based testing only provides a second order means for parameter testing. Additionally, the test patterns for functional-based testing are considered expensive to apply and, due to that expense, oftentimes not all patterns are supplied during the testing process. Scan-based testing techniques do not measure parameters at all.

Parametric measurements are typically taken during fabrication using chips. These scribe line measurement structures can be used to test both electrical and physical parameters, such as on-current ($I_{on}$), threshold voltage ($V_{th}$), etc., during manufacture after designated metal level processes are completed. Generally, the process flow for in-line testing includes, selecting a sample of wafers and then selecting, for testing, a sample of chips on each of the wafers in a sample, such that the same chips from each wafer are tested. The sample sizes are usually small due to the high costs associated with in-line testing. For example, the samples may include only 20% of the wafers in a lot and only 25% of the chips on each selected wafer. During in-line testing, the same scribe line measurement structure on each wafer is used to test all parts of the same selected chip on each wafer. Maverick screening (i.e., scrapping wafers) is often performed based on the results of the testing. For example, if too many chips on a specific wafer in the sample fail (i.e., too many chips on a wafer are found to have a parameter value that deviates from the optimal design parameter by a predetermined value), then that entire wafer, including any passing chips on the wafer, will be scrapped. Furthermore, if too many wafers in a lot are scrapped, the entire lot, including passing wafers in the lot, will be scrapped. Then, if the lot is not scrapped the remaining wafers in the lot, including those wafers having some failing chips, but not enough to warrant scrapping, will move to final testing and potentially on to customers.

Unfortunately, for a number of reasons, the scribe line parametric measurements taken during in-line testing are not optimal for semiconductor product disposition. First, as discussed above, the Maverick screening methods may allow some good chips or good wafers to be scrapped and further may allow some bad chips to pass on to the customer. Second, correlation between the results of in-line testing to the results of functional and/or scan-based tests during final testing is difficult due to the small number of chips/wafer and wafers/lot tested in-line. Third, these in-line tests are generally performed by contacting the scribe line measurement structures with a probe in a less than optimal electrical environment, thereby introducing measurement uncertainty. Finally, the scribe lines and, thus, the measurement structures in the scribe lines are oftentimes surrounded by a different optical environment than the product (i.e., chip) itself so that the parametric measurements of the scribe line measurement structures do not match those of the product.

Additionally, for a number of reasons, the scribe line parametric measurements taken during in-line testing cannot readily be used to identify parametric impact on product yield. First, the correlation between the results of in-line testing with yield is difficult because of the potential measurement errors addressed above (e.g., errors due to small sample size, different electrical/optical environments between product and scribe line measurement structures, etc.). Second, identifying the magnitude of the yield impact caused by parametric deviations is also difficult due to the small sample size. Third, some parametric deviations, which are identified during in-line testing, may not actually impact yield; whereas other parametric deviations, which do impact yield, may not be identified during in-line testing (e.g., because only a small sample of wafers and chips are tested). Fourth, oftentimes the in-line scribe line parametric measurements are composite measurements (e.g., effective channel length $L_{eff}$), rather than individual parametric measurements and it is only one of the individual parameters (e.g., threshold voltage ($V_{th}$), poly line width, etc.) that has an impact on yield. Finally, if multiple parametric deviations are found, there is currently no means to prioritize which parametric deviation has the most impact on yield.

Recently, parametric measurement elements have been developed which can easily be incorporated into chip designs and which can be used to efficiently and economically measure device parameters from within the chip itself. One such parametric measurement element, referred to as a scalable parametric measurement macro, is disclosed in both U.S. patent application Ser. No. 11/459,367, filed on Jul. 24, 2006 and published in U.S. Patent Application Publication No. 2008/0018356, and U.S. patent application Ser. No. 11/611,623, filed on Dec. 15, 2006 and published in U.S. Patent Application Publication No. 2008/0148197, both of which are assigned to the same assignee as the present invention and are incorporated herein by reference.

Specifically, referring to FIG. 1, this scalable parametric measurement macro 100 comprises a plurality of test circuits 120 (i.e., device under test (DUT) circuits) that are coupled to a control logic block 130 and to a power supply connection block 110. Each DUT circuit 120 is configured to test one or more physical or electrical parameters (e.g., on current ($I_{on}$), threshold voltage ($V_{th}$), etc.). The control logic 130 is used to activate and deactivate individual DUT circuits 120 during testing. The power supply connections 110 are adapted to supply power to the individual DUT circuits 120 in order to perform different types of tests. U.S. patent application Ser. No. 11/459,367 and, particularly, paragraphs [0028] and [0054] of the published application (U.S. Patent Application Publication No. 2008/0018356 incorporated by reference above) discloses the following: "FIG. 1 shows an SPM macro 100 of the present invention. SPM macro 100 includes a logic control 110, a group of decode level translators (DLT) 120a-d (four DLTs are shown in this example), a pFET SPI circuit 140 coupled to an SPI control circuit 130, and a DUT 170, which represents one device type (in this example, an array of pFETs). SPM macro 100 further includes a nFET SPI circuit 150 coupled to SPI control circuit 160 and a DUT 180, which represents a second device type (in this example, an away of nFETs)." and "The SPM may be placed in various locations within an ASIC design to test different areas of the same chip. Alternative DUT structures may also be incorporated into the design such that each SPM is able to test a particular DUT structure in proximity to it. A single SPM may also be designed to test multiple varieties of DUT structures, such as wires, resistors, capacitors, inductors, etc., within a specific chip location." U.S. patent application Ser. No. 11/611,623 further discloses that these scalable parametric measurement macros can be customized with specific DUTs to allow for customized parametric testing, depending upon the product specifications.

In view of the foregoing, disclosed herein are testing method embodiments in which, during post-manufacture testing (e.g., during functional or scan-based testing performed after product fabrication), various electrical and physical parametric measurements are taken from on-chip parametric measurement elements and are used to optimize manufacturing in-line parametric control learning and/or to optimize product screening processes. Specifically, these post-manufacture parametric measurements can be used to disposition chips without shipping out non-conforming products, without discarding conforming products and without requiring high cost functional tests. They can also be used to identify yield sensitivities to parametric variations from design and to provide feedback for manufacturing line improvements based on the yield sensitivities. Additionally, a historical database regarding the key parameters that are monitored at both the fabrication and post-fabrication levels can be used to predict future yield and, thereby, to preemptively improve the manufacturing line and/or also to update supply chain forecasts. Also disclosed are program storage device embodiments that are readable by computer and that tangibly embody a program of instructions executable by that computer to perform one or more of these testing method embodiments.

Figure 2:
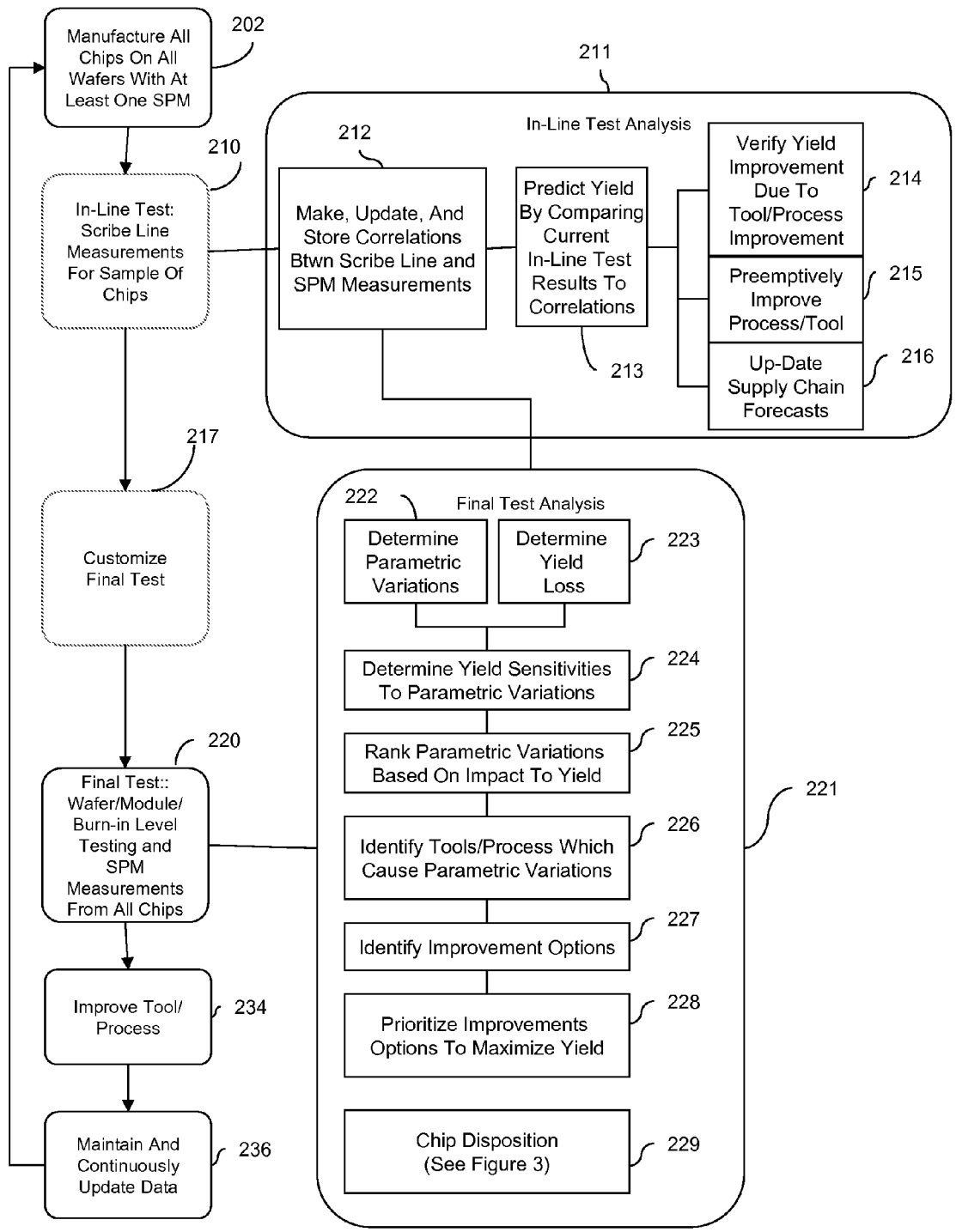
FIG. 2 is a flow diagram illustrating a testing method embodiment of the invention.
Figure 3:
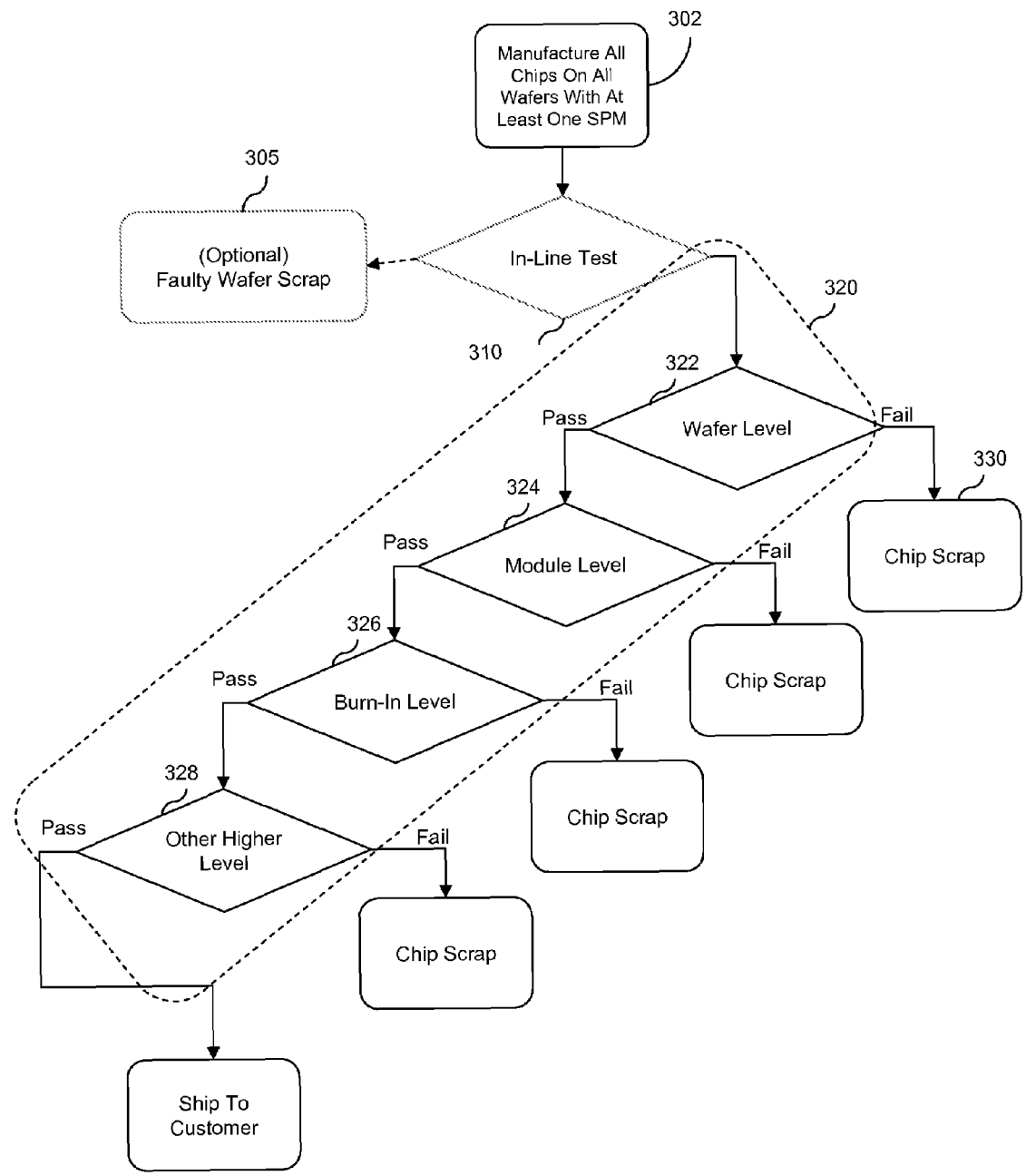
FIG. 3 is a flow diagram illustrating another testing method embodiment of the invention.

More specifically, a plurality of chips (i.e., a plurality of identical dies, integrated circuit devices, semiconductor products, etc.) are designed and fabricated on each wafer in each lot such that each chip comprises at least one parametric measurement element (see items 202 of FIGS. 2 and 302 of FIG. 3).

As used herein the terminology "testing chips after manufacture" refers to testing items that are fuller operation and do not require any additional processing to be operational for the end user. However, these manufactured chips can be attached to other components, can have packaging added, can be encased within a larger overall product, etc. Thus, manufactured chips are not subjected to any additional manufacturing processes, excepth those that combine the chips with other devices.

Each parametric measurement element can comprise, for example, the scalable parametric measurement macro 100 of FIG. 1 (as illustrated and described in U.S. patent application Ser. No. 11/459,367 and U.S. patent application Ser. No. 11/611,623, discussed and incorporated by reference in paragraph [0025]) or any other similar on-chip parametric performance monitoring system, which does not require a specific external pin-out.

As with conventional testing methods, after fabrication, the chips from each lot are tested at one or more levels (see item 220 of FIG. 2 and item 320 of FIG. 3). For example, conventional functional and/or scan-based testing can be performed on chips at the wafer level, module level, burn-in level and/or any other higher level (e.g., at the application level). This final testing, regardless of the level, can rely on specific input/output (I/O) specifications (e.g., DC leakage current ($I_{dd}$), performance scan ring oscillator (PSRO) circuit speed, etc.) to determine yield loss. However, in the embodiments disclosed herein, as the chips are being tested at any one or all of these final testing levels, parametric measurements are also taken from at least one of the parametric measurement elements on each of the chips tested. The benefits of implementing such on-chip parametric performance monitoring systems during final test far outweigh the minimal amount of time and costs associated with adding them to the chips and performing the required measurements.

In each of the method embodiments, the actual electrical and/or physical parametric measurements (e.g., SPM measurements) taken during final testing can be analyzed in light of design parameters to determine variations between the actual values for specific parameters on each chip and the design values for those same parameters (i.e., to determine parametric variations). The results can be used in a variety of subsequent method steps.

Referring to FIG. 2, in a first embodiment parametric control learning can be optimized and, optionally, so can product screening. That is, the first embodiment can be implemented alone or in conjunction with the below-described second embodiment (see FIG. 3). In this first embodiment, product yield loss is determined conventionally based on the results of functional and/or scan-based final testing techniques (see process 223). This product yield loss is then correlated with the parametric measurements that were also taken during final testing and, specifically, with any variations identified (at process 222) between the actual values for specific parameters on each chip and the design values for those same parameters (i.e., the values for those same parameters assumed during design) in order to identify yield sensitivities to specific parametric variations (see process 224). The parametric variations can then be ranked based on which is determined to have the greatest negative impact on yield (see process 225).

Basing yield impact determinations on parametric measurements taken from on-chip parametric measurement elements during final testing is an improvement of making such determinations based on the scribe line parametric measurements taken during in-line testing for a number of reasons. For example, the correlation between the results of post-manufacture on-chip testing with yield is more accurate because there is less potential for error since the sample size is large (i.e. all chips are tested) and because the electrical/optical environments of the product and parametric measurement elements are the same. Additionally, since the sample size is large and the parametric measurement elements typically measure individual device composite measurements, it is easier to identify those deviations that do in fact impact yield as well as to identify the magnitude of that yield impact.

Then, manufacturing process and/or tool improvements can be designed (i.e., developed, proposed, etc.) to limit these variations and can further be ranked according to which will have the greatest positive impact on yield (see processes 226-228). Specifically, the various processes and tools used to manufacture the product (i.e., used to manufacture the chip) can be analyzed in order to identify the one or more manufacturing tools and/or processes, which cause the specific parameter variations that are identified at process 224 as affecting yield and specifically that are identified as having the greatest negative impact on yield (see process 226). Then, options for improving these manufacturing tools and/or processes can be determined (i.e., developed, planned, proposed, etc.) (see process 227) and prioritized according to which improvement will potentially have the greatest positive impact on yield (i.e., will maximize yield improvement) (see process 228). The manufacturing tools and/or processes can then be improved upon accordingly (see process 234). As each lot is manufactured and tested, data regarding parametric measurements, variations, yield sensitivities, manufacturing line improvements, etc. is continuously updated (see process 236). Thus, a historical database containing key monitored parameters is established and maintained.

Referring to FIG. 3, in a second embodiment screening processes can be optimized and, optionally, so can parametric control learning. That is, the second embodiment can be implemented alone or in conjunction with the above-described first embodiment, as illustrated in FIG. 2 (see chip disposition step 229 of FIG. 2). In this second embodiment, faulty chips can be identified based on the parametric measurements (i.e., the actual SPM measurements) taken during one or more of the various final testing levels 320 (e.g., during wafer level testing (see process 322), module level testing (see process 324), burn-in level testing (see process 326), application level testing (see process 328), etc.). Specifically, the faulty chips can be identified based on any variations between the actual measured values for specific parameters on each chip at each level of final testing and the design values for those same parameters. Once identified, these faulty chips can be discarded from the lot (i.e., screened-out, scrapped, etc.), while all other chips on the wafer can be retained and passed on for higher level testing (see process 330).

Specifically, a faulty chip can be identified, for example, as any chip that has an actual parametric measurement that does not meet a predetermined chip pass/fail criterion (i.e., that deviates from the design value by a predetermined amount). Alternatively, a faulty chip can be identified as any chip that has greater than a predetermined number of actual parametric measurements (e.g., greater than 1, greater than 2, etc.) that do not meet predetermined pass/fail criteria (i.e., that deviate from the design value by a predetermined amount). The chip pass/fail criteria can be determined prior to testing and can be based, for example, on the proposed uses for the product.

For example, the same chip may be used in two different applications but, depending upon the application, may have different failure tolerances. Thus, the pass/fail criterion may be the same at lower testing levels (e.g., wafer level 322, module level 324, etc.), but different at higher testing levels (e.g., burn-in level 326, application level or other higher level 328, etc.). For example, a chip may pass all screening at the wafer level 322, where the pass/fail criterion for a given parametric measurement allows for greater variations. However, at the application level 328, that same chip may pass screening for application A, but fail screening for application B, where tight parametric control is required.

In each of the method embodiments as illustrated in FIGS. 2 and 3, the post manufacture parametric testing 220, 320 described above, can also optionally be performed in addition to (i.e., following) in-line parametric testing (see process 210 of FIG. 2 and process 310 of FIG. 3). Conventional in-line testing involves testing only a sample of chips selected from only a sample of wafers in a lot during manufacture. The in-line parametric measurements are generally taken from measurement structures in the scribe lines of the selected sample of wafers. In the method embodiments disclosed herein, the scribe line measurement structures can comprise either the exact same structures as the on-chip parametric measurement elements (e.g., scalable parametric measurement macros 100 of FIG. 1) or completely different structures as long as they have known correlations to the on-chip parametric measurement elements. The results of the in-line parametric testing can be used in a variety of subsequent method steps.

For example, in conjunction with the first embodiment, described above and illustrated in FIG. 2, during in-line test analysis (see process 211) correlations (i.e., in-line to post manufacture parametric measurement correlations) can be made between the scribe line parametric measurements taken from the scribe line measurement structures during in-line testing and the parametric measurements (e.g., the SPM measurements) that are subsequently taken from the on-chip parametric measurement elements during final test (i.e., after in-line testing, after manufacture) (see process 212). With repeated manufacturing and testing of multiple lots, data can be continuously updated and stored (e.g., in a historical database) so that the correlations between in-line measurements and post-manufacture measurements are ever more accurate (see process 212). These correlations can further be used when analyzing subsequent in-line testing results in order to predict the yield of a given lot (i.e., to make future yield predictions), based on the current in-line testing of that lot (see process 213).

Specifically, after one or more lots of wafers are manufactured and tested, correlations can be made between the in-line and post-manufacture parametric measurements (see process 212). Then, when in-line testing of a new sample of chips on a new sample of wafers from a new lot is performed at process 210, the results of the in-line tests can be analyzed and predictions can be made regarding what the post-manufacture parametric measurements of the new chips will be, based on a comparison of the current in-line measurements and the previously determined correlations (see processes 211-213) Since yield sensitivity to parametric measurement variations was also previously determined and continuously updated in the historical database with each lot tested, the predicted post-manufacture parametric measurements can be used to make a yield prediction for the new lot. This yield predication can be used to verify the effectiveness of any improvements made to the manufacturing tools and/or processes (see process 214). Additionally, based on the yield prediction for the new lot, any additional improvements to the manufacturing tools and/or processes can be proposed and pre-emptively made and/or the supply-chain forecasts can be updated (see processes 215-216). Thus, customer serviceability problems can be minimized.

Additionally, these in-line to post manufacture parametric measurement correlations from process 212 can be used to customize future post-manufacture testing at process 217. Specifically, these correlations can be stored along with the results of current in-line testing. Prior to final test (see process 220), both the in-line to post manufacture parametric measurement correlations and the current in-line test results can be accessed and used to determine which chip sites should be used for final test. That is, the current in-line test results and in-line to post manufacture parametric measurement correlations can be used to customize final testing. Specifically, based on theses correlations the accuracy of the various in-line parametric measurements is better understood. Thus, for example, if a given in-line measurement is generally considered to be very accurate in light of the correlations and a current measurement is considered "bad" based on a predetermined criterion, then the chip site where that current measurement was taken can be considered a "known bad site" and can be removed from post-manufacture testing in order to save test-time.

Furthermore, in conjunction with the second embodiment, described above and illustrated in FIG. 3 (which again can be implemented alone or with the first embodiment of FIG. 2), Maverick screening of wafers (i.e., the discarding, screening-out or scrapping of wafers) can optionally be performed based on the results of the in-line parametric measurements taken from scribe line measurement structures. That is, after the in-line parametric testing is performed at process 310, all of the chips on all of the wafers in each lot can be passed on for final testing at process 320, regardless of the values of the in-line parametric measurements taken from the scribe line measurement structures. Thus, no chip, wafer, or lot is scrapped during fabrication and even after fabrication neither entire lots, nor entire wafers are scrapped. Rather only chips are discarded and only if they fail to meet predetermined pass/fail criteria during any level 322-328 of post-manufacture testing 320.

By basing chip disposition on post-manufacture on-chip parametric measurements taken from each chip on each wafer, product disposition and screening processes are optimized for a variety of reasons over the prior art Maverick screening processes, described above, which relied on in-line parametric measurements from scribe line measurement structures. Specifically, correlation between the results of in-line post-manufacture parametric testing to the results of functional and/or scan-based tests post-manufacture testing is not difficult because all chips/wafer and all wafers/lot are tested. Additionally, the post-manufacture electrical and optical environments of the on-chip parametric elements are the same as that of other on-chip structures so measurement uncertainty is minimized. Therefore, since each chip is measured and screened individually and since the measurements taken are more accurate, there is little risk of screening out good chips or allowing bad chips to be passed on to the customer.

In a different embodiment, after in-line testing is performed at process 310, faulty wafers within each sample of wafers tested can be identified and discarded (305). A faulty wafer can be identified, for example, as any wafer in which a predetermined number or more of the tested sample of chips on the wafer fail. As discussed above with regard to post-manufacture testing, a faulty chip can be identified during in-line testing as any chip that has an actual parametric measurement that does not meet a predetermined chip pass/fail criterion (i.e., that deviates from the design value by a predetermined amount). Alternatively, a faulty chip can be identified as any chip that has greater than a predetermined number of actual parametric measurements (e.g., greater than 1, greater than 2, etc.) that do not meet the predetermined pass/fail criteria (i.e., that deviate from the design value by a predetermined amount). Note the pass/fail criteria during in-line testing can be the same or different than the post-manufacture pass/criteria. Any individual wafers that are considered to be faulty can be discarded.

Once faulty wafers are discarded, all remaining wafers in the lot can be passed on to final testing. Screening out faulty wafers balances the time required to test all chips on a wafer, when it is known that a significant number of those chips are faulty, with the possible loss of a few good chips. Alternatively, instead of passing on all remaining wafers in the lot to final testing, an entire lot can be discarded, if a predetermined number of more of the tested wafers are considered faulty. That is, the time required to test all wafers in a lot can be balanced against the loss of a few good chips on a few good wafers, when a gross issue is already detected during in-line testing.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital video disk (DVD).

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
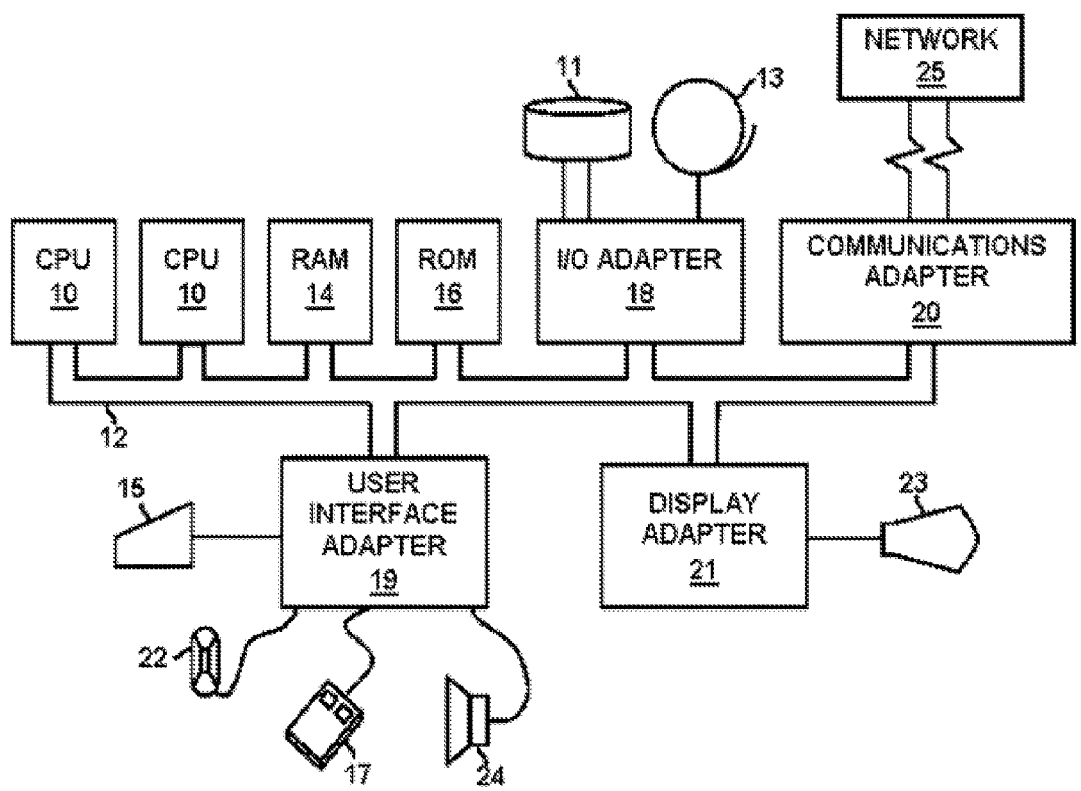
FIG. 4 is a schematic representation of a computer system suitable for use in implementing the testing method embodiments as described herein.

A representative hardware environment for practicing the embodiments of the invention is depicted in FIG. 4. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Therefore, disclosed above are testing method embodiments in which, during final testing (e.g., during functional or scan-based testing performed after product fabrication), various electrical and derived physical measurements are also taken from on-chip parametric measurement elements and used to optimize manufacturing in-line parametric control learning and/or to optimize product screening processes. Specifically, these post-manufacture parametric measurements can be used to disposition chips without shipping out non-conforming products, without discarding conforming products and without requiring high cost functional tests. These post-manufacture parametric measurements can also be used to identify yield sensitivities to parametric variations from design and to provide feedback for manufacturing line improvements based on the yield sensitivities. Additionally, a historical database regarding the key parameters that are monitored at both the fabrication and post-fabrication levels can be used to predict future yield and, thereby, to preemptively improve the manufacturing line and/or also to update supply chain forecasts. Also disclosed are program storage device embodiments that are readable by computer and that tangibly embody a program of instructions executable by that computer to perform one or more of these testing method embodiments.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A testing method for chips, said method comprising:
    testing all chips from a lot after manufacture,
        wherein each chip comprises a parametric performance monitoring system on said chip, wherein said parametric performance monitoring system comprises at least one on-chip parametric measurement macro comprising a plurality of individually selectable test circuits to perform different types of tests,
wherein each of said individually selectable test circuits comprises a device under test,
wherein at least two devices under test comprise different types of devices under test, and
wherein, for each chip, said testing comprises taking, by said parametric performance monitoring system on said chip, parametric measurements from said at least one on-chip parametric measurement macro, said parametric measurements comprising actual measured values for at least one parameter for each device under test and said at least one parameter comprising one of on current (Ion) and threshold voltage (Vt);
determining yield loss based on results of said testing of said all of said chips; and
correlating said yield loss with said parametric measurements to identify yield sensitivity to variations in said parametric measurements.

2. The method of claim 1, wherein said testing comprises at least one of wafer level testing, module level testing, burn-in level testing and application level testing.

3. The method of claim 2, further comprising:
identifying faulty chips at any one of said wafer level testing, said module level testing, said burn-in level testing and said application level testing, wherein any chip, having a predetermined number of said parametric measurements that do not meet predetermined pass/fail criteria, is considered faulty, said predetermined number being greater than one; and
discarding said faulty chips.

4. The method of claim 1, wherein said individually selectable test circuits are each coupled to a control block and to a power supply and wherein said different types of devices under test comprise at least any two of an array of field effect transistors, a resistor, a capacitor, and an inductor.

5. The method of claim 1, further comprising:
analyzing manufacturing processes and tools to identify at least one of a tool and a process which causes said variations in said parametric measurements and, thereby, affects yield; and
improving upon said at least one of said tool and said process.

6. The method of claim 1, further comprising, before said testing of said chips to determine said yield loss, performing in-line testing by taking additional parametric measurements from scribe line measurement structures in scribe lines of said wafer.

7. The method of claim 6, wherein said scribe line measurement structures comprise the same structures as said parametric measurement macro such that said scribe line measurement structures similarly comprise a plurality of individually selectable test circuits each coupled to a control block and to a power supply and each configured to determine at least one of on current (Ion) and threshold voltage (Vt).

8. The method of claim 6, further comprising:
determining correlations between said additional parametric measurements taken from said scribe line measurement structures during said in-line testing and said parametric measurements taken from said parametric measurement macro after said in-line testing; and
using said correlations following subsequent in-line testing of subsequently manufactured chips on subsequently manufactured wafers to at least one of making a yield prediction and customize subsequent testing after manufacture for said subsequently manufactured chips.

9. The method of claim 8, further comprising, based on said yield prediction, one of pre-emptively making manufacturing line improvement and updating supply-chain forecasts.

10. A program storage device readable by computer and tangibly embodying a program of instructions executable by said computer to perform a testing method for chips, said method comprising:
testing all chips from a lot after manufacture,
wherein each chip comprises a parametric performance monitoring system on said chip,
wherein said parametric performance monitoring system comprises at least one on-chip parametric measurement macro comprising a plurality of individually selectable test circuits to perform different types of tests,
wherein each of said individually selectable test circuits comprises a device under test,
wherein at least two devices under test comprise different types of devices under test, and
wherein, for each chip, said testing comprises taking, by said parametric performance monitoring system on said chip, parametric measurements from said at least one on-chip parametric measurement macro, said parametric measurements comprising actual measured values for at least one parameter for each device under test and said at least one parameter comprising one of on current (Ion) and threshold voltage (Vt);
determining yield loss based on results of said testing of said all of said chips; and
correlating said yield loss with said parametric measurements to identify yield sensitivity to variations in said parametric measurements.

11. The program storage device of claim 10, wherein said testing comprises at least one of wafer level testing, module level testing, burn-in level testing and application level testing.

12. The program storage device of claim 10, wherein said method further comprises:
identifying faulty chips at any one of said wafer level testing, said module level testing, said burn-in level testing and said application level testing, wherein any chip, having a predetermined number of said parametric measurements that do not meet predetermined pass/fail criteria, is considered faulty, said predetermined number being greater than one; and
discarding said faulty chips.

13. The program storage device of claim 10, wherein said individually selectable test circuits are each coupled to a control block and to a power supply and wherein said different types of devices under test comprise at least any two of an array of field effect transistors, a resistor, a capacitor, and an inductor.

14. The program storage device of claim 10, wherein said method further comprises:
analyzing manufacturing processes and tools to identify at least one of a tool and a process which causes said variations in said parametric measurements and, thereby, affects yield; and
improving upon said at least one of said tool and said process.

15. The program storage device of claim 10, wherein said method further comprises, before said testing of said chips to determine said yield loss, performing in-line testing by taking additional parametric measurements from scribe line measurement structures in scribe lines of said wafer.

16. The program storage device of claim 15, wherein said scribe line measurement structures comprise the same structures as said parametric measurement macro such that said scribe line measurement structures similarly comprise a plurality of individually selectable test circuits each coupled to a control block and to a power supply and each configured to determine at least one of on current (Ion) and threshold voltage (Vt).

17. The program storage device of claim 15, wherein said method further comprises:
determining correlations between said additional parametric measurements taken from said scribe line measurement structures during said in-line testing and said parametric measurements taken from said parametric measurement macro after said in-line testing; and
using said correlations following subsequent in-line testing of subsequently manufactured chips on subsequently manufactured wafers to at least one of making a yield prediction and customize subsequent testing after manufacture of said subsequently manufactured chips.

18. The program storage device of claim 17, based on said yield prediction, one of pre-emptively making a manufacturing line improvement and updating supply-chain forecasts.

19. A testing method for chips manufactured with on-chip parametric measurement macros, said method comprising:
testing all chips from a lot after manufacture,
wherein each chip comprises a parametric performance monitoring system on said chip,
wherein said parametric performance monitoring system comprises at least one on-chip parametric measurement macro comprising a plurality of individually selectable test circuits to perform different types of tests,
wherein each of said individually selectable test circuits comprises a device under test,
wherein at least two devices under test comprise different types of devices under test, and
wherein, for each chip, said testing comprises taking, by said parametric performance monitoring system on said chip, parametric measurements from said at least one of said on-chip parametric measurement macro, said parametric measurements comprising actual measured values for at least one parameter for each device under test and said at least one parameter comprising one of on current (Ion) and threshold voltage (Vt);
identifying faulty chips, wherein any chip, having a predetermined number of said parametric measurements that do not meet predetermined pass/fail criteria, is considered faulty; and
discarding said faulty chips from said lot.

20. The method of claim 19, wherein said testing comprises at least one of wafer level testing, module level testing, burn-in level testing, and application level testing and wherein said different types of devices under test comprise at least any two of an array of field effect transistors, a resistor, a capacitor, and an inductor.

21. The method of claim 19, further comprising:
determining yield loss based on results of said testing; and
correlating said yield loss with said parametric measurements to identify yield sensitivity to variations in said parametric measurements.

22. The method of claim 19, further comprising determining said predetermined pass/fail criterion.

23. The method of claim 19, further comprising, performing in-line testing on a sample of said chips selected from a sample of wafers in said lot, wherein said in-line testing comprises taking additional parametric measurements from scribe line measurement structures in wafer scribe lines.

24. The method of claim 23, further comprising, after said performing of said in-line testing, performing said testing after manufacture on all of said chips on all of said wafers in said lot.

25. The method of claim 23, further comprising, after said performing of said in-line testing:
identifying faulty wafers;
discarding any of said faulty wafers; and
performing said testing after manufacture on all remaining wafers in said lot.

26. The method of claim 23, wherein said scribe line measurement structures comprise the same structures as said parametric measurement macros such that said scribe line measurement structures similarly comprise a plurality of individually selectable test circuits each coupled to a control block and to a power supply and each configured to determine at least one of on current (Ion) and threshold voltage (Vt).

27. A program storage device readable by computer and tangibly embodying a program of instructions executable by said computer to perform a testing method for chips manufactured with on-chip parametric measurement macros, said method comprising:
testing all chips from a lot after manufacture,
wherein each chip comprises a parametric performance monitoring system on said chip,
wherein said parametric performance monitoring system comprises at least one on-chip parametric measurement macro comprising a plurality of individually selectable test circuits to perform different types of tests,
wherein each of said individually selectable test circuits comprises a device under test,
wherein at least two devices under test comprise different types of devices under test, and
wherein, for each chip, said testing comprises taking, by said parametric performance monitoring system on said chip, parametric measurements from said at least one of said on-chip parametric measurement macro, said parametric measurements comprising actual measured values for at least one parameter for each device under test and said at least one parameter comprising one of on current (Ion) and threshold voltage (Vt);
identifying faulty chips, wherein any chip, having a predetermined number of said parametric measurements that do not meet predetermined pass/fail criteria, is considered faulty; and
discarding said faulty chips from said lot.

28. The program storage device of claim 27, wherein said testing comprises at least one of wafer level testing, module level testing, a burn-in level testing, and application level testing.

29. The program storage device of claim 27, further comprising:
determining yield loss based on results of said testing; and
correlating said yield loss with said parametric measurements to identify yield sensitivity to variations in said parametric measurements.

30. The program storage device of claim 27, wherein said method further comprises, performing in-line testing on a sample of said chips selected from a sample of wafers in said lot, wherein said in-line testing comprises taking additional parametric measurements from scribe line measurement structures in wafer scribe lines.

31. The program storage device of claim 30, wherein said method further comprises, after said performing of said in-line testing, performing said testing after manufacture on all of said chips on all of said wafers in said lot.

32. The program storage device of claim 30, wherein said method further comprises, after said performing of said in-line testing:
- identifying faulty wafers;
- discarding any of said faulty wafers; and
- performing said testing after manufacture on all remaining wafers in said lot.

33. The program storage device of claim 30, wherein said scribe line measurement structures comprise the same structures as said parametric measurement macros such that said scribe line measurement structures similarly comprise a plurality of individually selectable test circuits each coupled to a control block and to a power supply and each configured to determine at least one of on current (Ion) and threshold voltage (Vt).

34. The method of claim 19, wherein said individually selectable test circuits are each coupled to a control block and to a power supply and wherein said different types of devices under test comprise at least any two of an array of p-type field effect transistors (PFETS), an array of n-type field effect transistors (NFETS), a resistor, a capacitor, and an inductor.

* * * * *